US009281845B1

(12) United States Patent
Lazier

(10) Patent No.: US 9,281,845 B1
(45) Date of Patent: *Mar. 8, 2016

(54) LAYERED REDUNDANCY ENCODING SCHEMES FOR DATA STORAGE

(71) Applicant: Amazon Technologies, Inc., Seattle, WA (US)

(72) Inventor: Colin L. Lazier, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/503,221

(22) Filed: Sep. 30, 2014

Related U.S. Application Data

(63) Continuation of application No. 13/535,294, filed on Jun. 27, 2012, now Pat. No. 8,869,001.

(51) Int. Cl.
| | |
|---|---|
| *H03M 13/29* | (2006.01) |
| *G06F 11/10* | (2006.01) |
| *H03M 13/35* | (2006.01) |
| *G06F 3/06* | (2006.01) |

(52) U.S. Cl.
CPC ......... *H03M 13/2906* (2013.01); *G06F 3/0604* (2013.01); *G06F 11/1076* (2013.01); *H03M 13/35* (2013.01)

(58) Field of Classification Search
CPC ..... G06F 3/064; G06F 3/0614; G06F 3/0519; G06F 3/0689; G06F 3/06; G06F 3/067; G06F 17/30073; G06F 11/085; H03M 13/293; H03M 13/03
USPC ........... 714/763, 769, 755; 711/115, 112, 161
See application file for complete search history.

(56) References Cited

U.S. PATENT DOCUMENTS

| | | | |
|---|---|---|---|
| 5,542,065 | A | 7/1996 | Burkes et al. |
| 5,613,085 | A | 3/1997 | Lee et al. |
| 5,822,142 | A | 10/1998 | Hicken |
| 5,974,544 | A | 10/1999 | Jeffries et al. |

(Continued)

OTHER PUBLICATIONS

Wang Kechao; Jia Zongfu; Zong Ming Kui; Yu Jingwei, "Research of network storage system based on erasure code," Electronic and Mechanical Engineering and Information Technology (EMEIT), 2011 International Conference on , vol. 3, no., pp. 1470, 1474, Aug. 12-14, 2011.*

(Continued)

*Primary Examiner* — Cynthia Britt
(74) *Attorney, Agent, or Firm* — Kilpatrick Townsend & Stockton LLP

(57) ABSTRACT

Techniques for optimizing data storage are disclosed herein. In particular, methods and systems for implementing redundancy encoding schemes with data storage systems are described. The redundancy encoding schemes may be scheduled according to system and data characteristics. The schemes may span multiple tiers or layers of a storage system. The schemes may be generated, for example, in accordance with a transaction rate requirement, a data durability requirement or in the context of the age of the stored data. The schemes may be designed to rectify entropy-related effects upon data storage. The schemes may include one or more erasure codes or erasure coding schemes. Additionally, methods and systems for improving and/or accounting for failure correlation of various components of the storage system, including that of storage devices such as hard disk drives, are described.

20 Claims, 10 Drawing Sheets

(56) References Cited

U.S. PATENT DOCUMENTS

| | | |
|---|---|---|
| 6,546,499 B1 | 4/2003 | Challener et al. |
| 7,055,013 B2 | 5/2006 | de Brbisson |
| 7,188,212 B2 | 3/2007 | Hajji |
| 7,305,605 B2 | 12/2007 | Shirogane et al. |
| 7,386,757 B2 | 6/2008 | Lindenstruth et al. |
| 7,587,631 B2 | 9/2009 | Shimmitsu |
| 7,599,261 B2 | 10/2009 | Achanta et al. |
| 7,721,186 B2 | 5/2010 | Bates et al. |
| 7,734,867 B1 | 6/2010 | Keeton et al. |
| 7,929,234 B1 | 4/2011 | Boyle et al. |
| 8,127,212 B2 * | 2/2012 | Wylie et al. .............. 714/785 |
| 8,149,528 B1 | 4/2012 | Suratman et al. |
| 8,234,537 B2 | 7/2012 | Pavlov et al. |
| 8,806,296 B1 | 8/2014 | Lazier et al. |
| 8,850,288 B1 | 9/2014 | Lazier et al. |
| 8,869,001 B1 * | 10/2014 | Lazier .............. 714/755 |
| 8,972,672 B1 | 3/2015 | Wallace et al. |
| 2001/0010085 A1 | 7/2001 | Rafanello et al. |
| 2003/0161245 A1 | 8/2003 | Henrichs |
| 2008/0221856 A1 | 9/2008 | Dubnicki et al. |
| 2009/0307525 A1 | 12/2009 | Hiratsuka et al. |
| 2012/0079189 A1 | 3/2012 | Colgrove et al. |
| 2012/0084504 A1 | 4/2012 | Colgrove et al. |
| 2012/0266044 A1 | 10/2012 | Hu et al. |
| 2013/0132800 A1 | 5/2013 | Healey, Jr. et al. |
| 2014/0032840 A1 | 1/2014 | Leggette et al. |
| 2015/0058582 A1 * | 2/2015 | Baldwin et al. .............. 711/158 |

OTHER PUBLICATIONS

Dimakis, A.G.; Godfrey, P.B.; Wu, Y.; Wainwright, M.J.; Ramchandran, K., "Network Coding for Distributed Storage Systems," Information Theory, IEEE Transactions on, vol. 56, No. 9, pp. 4539,4551, Sep. 2010.*

Skondric, G.; Konjicija, S., "System design for storage distributed system inside local network," Telecommunications Forum (TELFOR), 2011 19th, vol., no., pp. 1285,1288, Nov. 22-24, 2011.*

Guangping Xu; Sheng Lin; Gang Wang; Xiaoguang Liu; Kai Shi; Hua Zhang, "HERO: Heterogeneity-aware erasure coded redundancy optimal allocation for reliable storage in distributed networks," Performance Computing and Communications Conference (IPCCC), 2012 IEEE 31st International, vol., no., pp. 246,255, Dec. 1-3, 2012.*

U.S. Appl. No. 13/535,281, filed Jun. 27, 2012, Titled: "Correlated Failure Zones for Data Storage".

U.S. Appl. No. 13/535,294, "Non-Final Office Action", mailed Mar. 12, 2014, 16 pages.

U.S. Appl. No. 13/535,294, "Notice of Allowance", mailed Jun. 24, 2014, 12 pages.

* cited by examiner

LAYERED REDUNDANCY ENCODING SCHEMES FOR DATA STORAGE

CROSS-REFERENCE TO RELATED APPLICATIONS

This application is a continuation of application Ser. No. 13/535,294, filed Jun. 27, 2012, entitled "LAYERED REDUNDANCY ENCODING SCHEMES FOR DATA STORAGE (U.S. Pat. No. 8,869,001), and U.S. patent application Ser. No. 13/535,200, filed Jun. 27, 2012 (U.S. Pat. No. 8,806,296), and U.S. patent application Ser. No. 13/535,281, filed Jun. 27, 2012, entitled "CORRELATED FAILURE ZONES FOR DATA STORAGE (U.S. Pat. No. 9,110,797)," and U.S. patent application Ser. No. 13/535,306, filed Jun. 27, 2012 (U.S. Pat. No. 8,850,288), the respective disclosures of which are incorporated herein by reference in their entirety.

BACKGROUND

A considerable amount of data are generated and consumed in the course of modern electronic communication. Much of the generated data reside in long-term storage repositories, but in many cases, the stored data may not be accessed frequently. In many cases, the older the data are, the less frequently they are accessed. Similarly, less frequently accessed data may have lower performance requirements than more active data. Thus, data storage systems that are designed or implemented to handle the performance, accessibility and/or durability requirements of newer data may be overbuilt for older, "colder" data. While modern hierarchical hardware storage systems exist to make more efficient use of storage resources, it can be burdensome and/or difficult for such systems to scale with increasingly large numbers of concurrently connecting customers with different performance, accessibility and/or durability demands for stored data.

BRIEF DESCRIPTION OF THE DRAWINGS

Various embodiments in accordance with the present disclosure will be described with reference to the drawings, in which.

DETAILED DESCRIPTION

Figure 1:
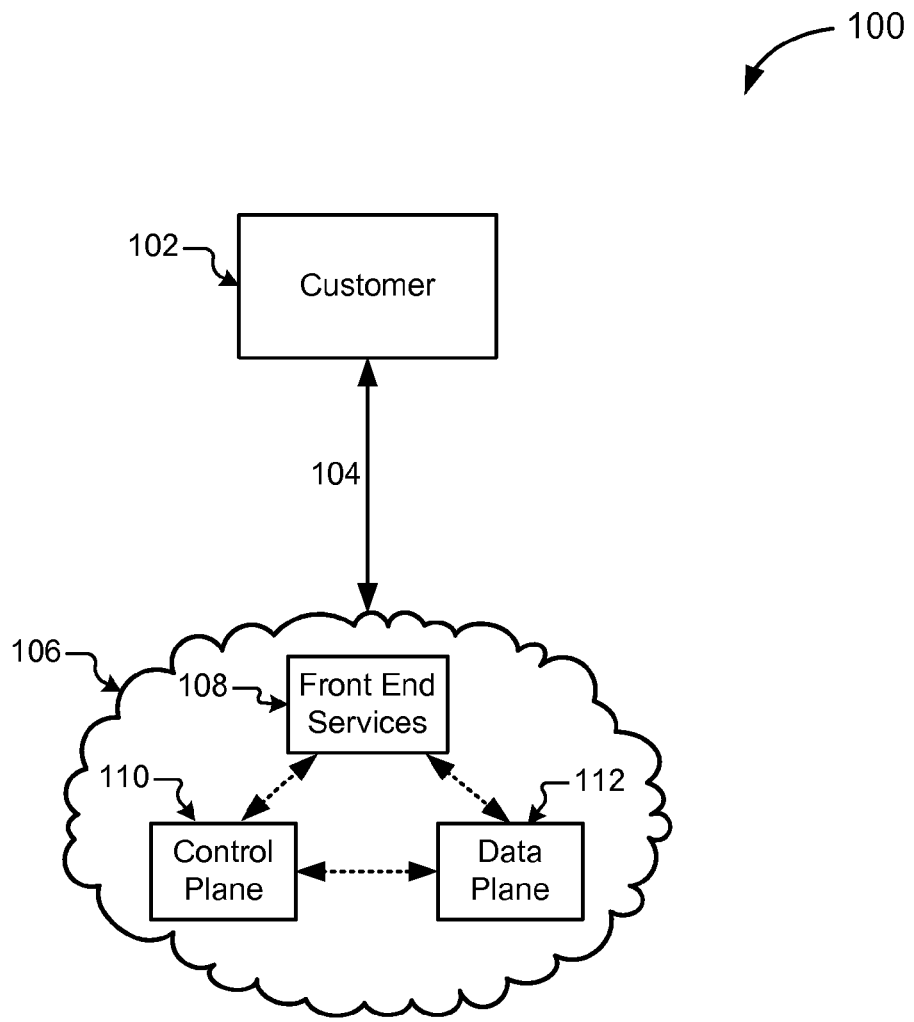
FIG. 1 shows an illustrative example of an environment for a redundancy encoding scheme for data storage in accordance with at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include systems and methods for implementing and/or supporting a configurable redundancy encoding scheme in and/or using a data storage system. For example, a redundancy encoding scheme to be applied to data on a data storage system may be adjusted based on a changing throughput, reliability, bandwidth or accessibility requirement for the data. The redundancy encoding scheme may be varied based on characteristics of the stored data objects (e.g., size), the intended use or pattern of access to the data, various operational characteristics of the storage system, or, in some embodiments, a customer-specified requirement for the data. In some embodiments, a general redundancy encoding scheme that is independent of one or more of the parameters described herein may be initially selected and applied, whereupon an additional or overriding encoding scheme may be determined based on such parameters and applied as changes to the various parameters become known to the system.

In another example described herein, the redundancy encoding scheme may include a scheduled, periodic or gradual encoding of or effect upon the stored data. For example, the system may determine (or a customer may specify) that data stored upon the data storage system will have access characteristics, such as frequency of access, that change over time. In such instances, a redundancy encoding scheme that accounts for, e.g., a gradual decay in access frequency may be specified to run against a determined schedule, in some cases applying increasingly aggressive redundancy encodings to match the decay. At each interval of the schedule, the system may determine an appropriate redundancy encoding to apply to the data based on at least one of a number of factors, including the age of the data.

Another example described herein includes a tiered redundancy encoding scheme that applies a different encoding to different tiers, or layers, of the storage system. For example, one layer may comprise a set of datacenters, another layer may comprise the storage servers within a given datacenter, and another layer may comprise the data storage devices in a given storage server or group of servers, such as hard disk drives. Such layers may be abstracted to any group of entities of the data storage system that share common failure modes, characteristics or the like. The redundancy encoding scheme may thus be tiered with a plurality of redundancy encodings to more closely account for the varying characteristics of each layer, and thus alter various operational characteristics of the entire system (e.g., durability of stored data, time to recover, time to failure and others). In some embodiments, a primary redundancy encoding scheme is applied to the overall system, and one or more secondary erasure coding schemes are determined or modified to track the topology or characteristics of the storage system.

Also as described herein, storage devices such as electromechanical hard disk drives may be modified to include failure-correlated write zones. For example, hard disk drives that probabilistically fail most frequently due to head strikes or actuator failures may be modified to correlate one write zone per platter side, such that when one head or actuator for a given platter side fails, the remaining platters remain functional and accessible. Such modifications may also include the forced remapping of any bad sectors within a given write zone to another, known good area within the same write zone, such that any failures are contained within the write zone. Such write zones may, in some embodiments, add an additional layer to the storage system, and thus, when implementing a tiered redundancy encoding scheme, may improve certain operational characteristics of the overall system.

FIG. 1 illustrates an example environment 100 in which a redundancy encoding scheme may be implemented. One or more customers 102 connect, via a network connection 104, to a data storage system 106. Unless otherwise clear from context, the term "customer" refers to the system(s) of a customer entity (such as an individual, company or other organization) that utilizes data storage services described herein. Such systems may include datacenters, mainframes, individual computing devices, distributed computing environments and customer-accessible instances thereof or any other system capable of communicating with the data storage system. In some embodiments, a customer may refer to a machine instance (e.g., with direct hardware access) or virtual instance of a distributed computing system provided by a computing resource provider that also provides the data storage system. In some embodiments, the data storage system integral to the distributed computing system, and may include or be implemented by an instance, virtual or machine, of the distributed computing system. The network connection may be a public network connection, such as an Internet connection, a private network connection (such as a virtual private network connection or direct network connection) or any other type of connection that places the customer in connection with the distributed storage system.

In some embodiments, the data storage system comprises multiple subsystems that each have a corresponding role. For example, as illustrated in FIG. 1, the data storage system may include a set of front end services 108, a control plane 110 and a data plane 112. In such embodiments, the front end services are implemented by a system that provides one or more public access components to interface the data storage system with external entities, such as the customers described herein. For example, the front end services may include an application programming interface (API) to enable a user to programmatically interface with the various features, components and capabilities of the data storage system. Such capabilities may include data storage, data retrieval, metadata queries, configuration of various operational parameters and the like. The front end services may also include customer authentication, customer authorization, usage metering and billing-related functions. Additionally, in some embodiments, the front end services may include an ingress and egress point for all data flowing into and out of the data storage system, e.g., to and from customers.

In some embodiments, the control plane provides transient storage or caching for data transiting between the data plane and the front end (and thus, to and from external entities). The term "plane" refers, in some embodiments, to a collection of individual components that together are a subsystem for providing a set of functionality. For example, in some embodiments, the data plane may include redundancy-encoded data, described in more detail below, that requires more time to access than would be reasonable for a customer to actively wait. As a related example, data ingested from a customer may require a considerable length of time to store. In such embodiments, the control plane provides temporary storage for data to be stored (and thus awaiting encoding) and data to be retrieved by a customer in a timeframe that is independent, from a customer perspective, of that of the data plane. Some embodiments may include job planning optimization, checkpointing and recovery for customer jobs, the benefits of which become more evident as the customer job becomes larger or more demanding.

In some embodiments, the data plane includes storage-related functionality, including storage hardware, detection of entropic effects upon data stored upon the storage hardware and anti-entropy correction routines. Entropic effects include, but are not limited to, performance degradation due to data fragmentation resulting from repeated write and rewrite cycles, hardware wear (e.g., of magnetic media), data unavailability and/or data loss due to hardware malfunction, environmental factors, physical destruction of hardware, random chance or other causes. The data plane may detect such effects and in some embodiments may preemptively and/or reactively institute anti-entropy correction routines and/or policies. Such anti-entropy correction measures may include, but are not limited to, the various redundancy encoding schemes described in detail herein. The storage hardware may include any number and type of storage devices and entities, such as datacenters, storage servers, hardware storage devices such as tape drives, hard disk drives and solid state devices, and the like. Such hardware may be organized into any topology, including hierarchical topologies.

Figure 2:
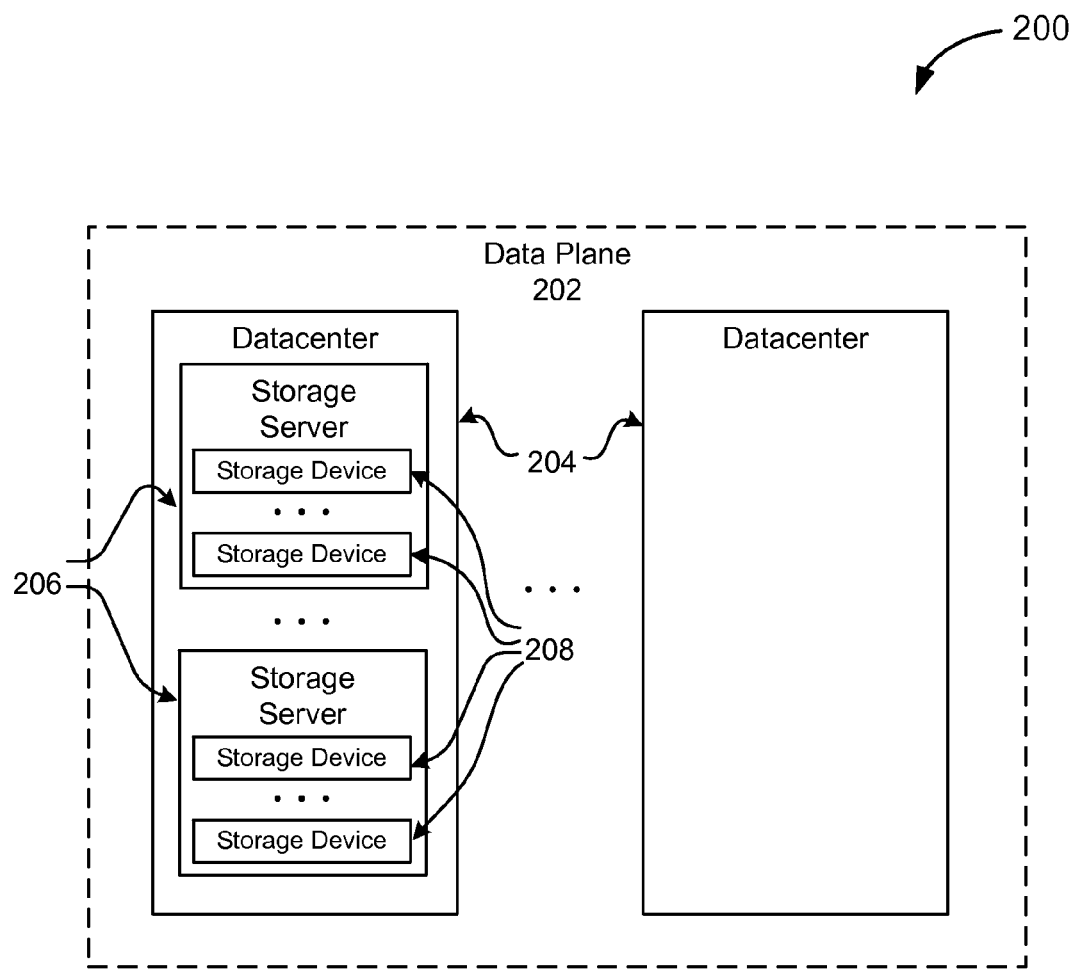
FIG. 2 shows an illustrative example of a data plane to which a redundancy encoding scheme may be applied in accordance with at least one embodiment.

FIG. 2 illustrates an example hardware topology 100 for a data storage system in which the techniques described herein may be applied. A data plane 202, similar in some embodiments to the data plane 112 described in connection with FIG. 1, includes a one or more datacenters 204. Each datacenter may be a facility, which may have its own postal address, and which may comprise one or more storage servers 206, which in turn each include one or more storage devices 208. The datacenters may, in some embodiments, be configured similarly to one another, or may contain differing numbers and/or types of constituent devices. Similarly, the storage servers and/or the storage devices may be uniform, tiered, differentiated or any combination thereof. For example, the storage devices, storage servers and/or datacenters may be organized in a differentiated fashion (e.g., by price, performance, capacity and/or function), such as would be the case in a typical hierarchical ("tiered") storage system. Such a hierarchical storage system may automatically move data between relatively higher-cost, higher-speed data storage devices and relatively lower-cost, lower-speed storage devices within the data plane.

As an alternative example, a simpler storage system may utilize a data plane wherein the various devices, servers and/or datacenters are substantially similar in price, performance, capacity and/or functional attributes. As may be contemplated, storage devices may include any media capable of storing data and in any configuration, including solid state storage devices (SSDs), conventional electromechanical hard disk drives, hybrid hard disk drives, shingled magnetic recording hard drives, optical media, optoelectrical media, magneto-optical media and tape drives. In some embodiments, such storage devices, including hard drives, are not enterprise-level drives, but are, e.g., consumer-level or commodity-level drives that may not have a large number of reliability-enhancing features. Likewise, datacenters, storage servers and storage devices may be physical, virtual or any abstraction thereof (e.g., instances of distributed storage and/or computing systems). Similarly, the components of the data plane may be dispersed, local or any combination thereof. For example, various computing and/or governing components (such as those portions responsible for entropic effects detection and related corrective measures) may be local or remote to any number of datacenters, servers or storage devices, which in turn may be local or remote relative to one another. Any of the exemplary storage system configurations described herein, as well any other storage system configuration or combination, may benefit from the various techniques described herein, and in particular the various redundancy encoding techniques described in more detail herein.

Figure 3:
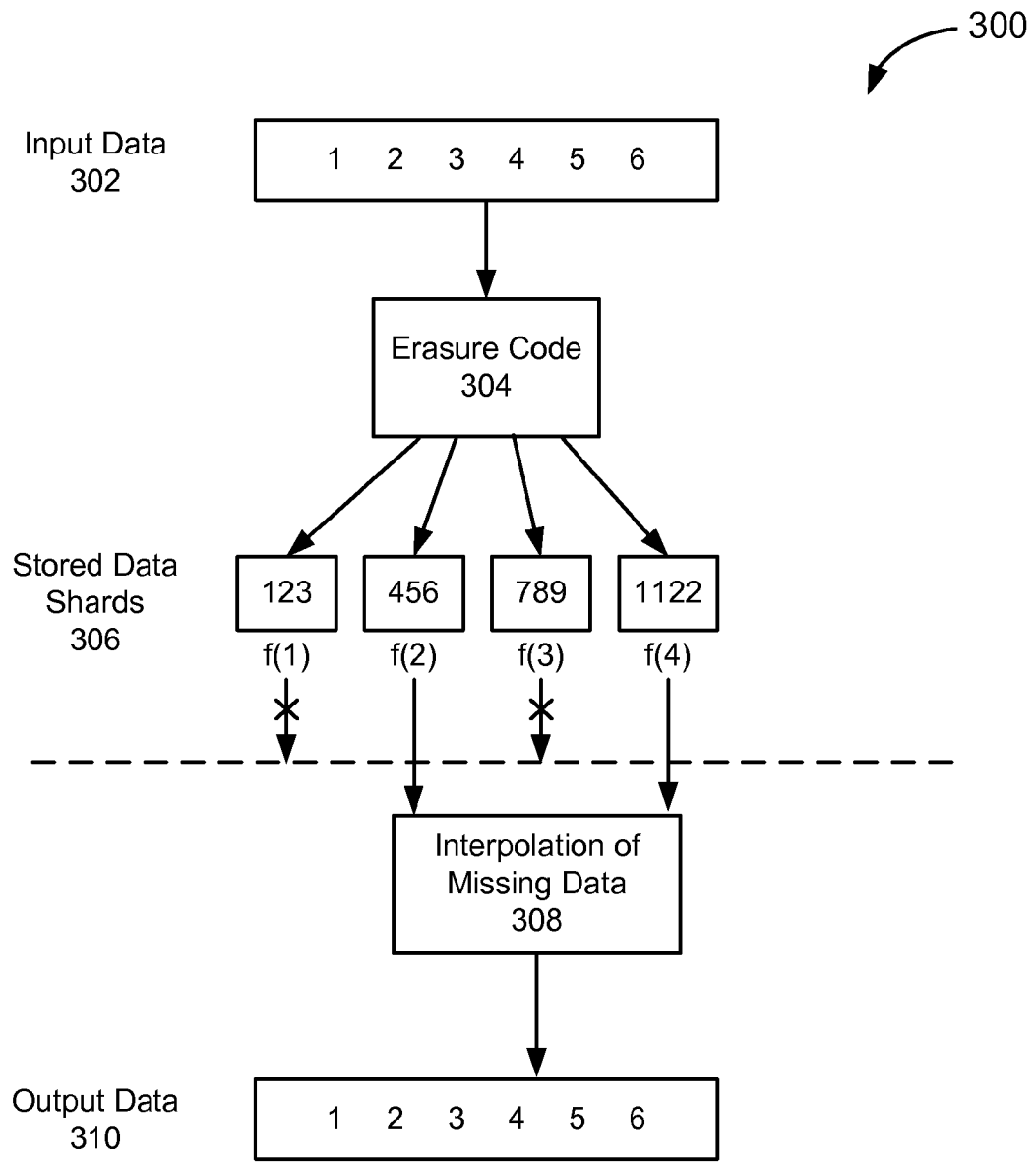
FIG. 3 shows an illustrative example of a redundancy code being applied in accordance with at least one embodiment.

FIG. 3 illustrates an exemplary redundancy encoding process 300 being applied to an illustrative block of data 302. The provided illustration is simplified for clarity of example. Various redundancy encoding schemes, such as forward error correction schemes that include, as one example, erasure codes, may be used to increase the stored reliability, redundancy, durability and other related attributes of data and the entities upon which they are stored. To achieve such increased durability attributes, input data 302 is subject to a transformative function, such as one or more erasure codes 304, to generate blocks ("shards") of encoded data 306. As illustrated, the quantity of encoded data is greater than the quantity of the original, inputted data. In the example provided, the numeral "123456" is provided as input data, which is broken into two blocks, "123" and "456," which are assigned identifiers "a" and "b," respectively. The blocks are subject to the transformative function, $f(i)=a+(b-a)(i-1)$ in the example given, and the function is calculated with respect to several values of i, where i may be a positive integer. Here, $i=1$ and $i=2$ provide the blocks comprising the original data. As the exemplary transformative function is linear, any two output blocks may be used to interpolate the values of $f(1)$ and $f(2)$ 308 and thus reconstruct the original input data 310, so long as the reconstructive entity has knowledge of the transformative function and that $f(1)$ and $f(2)$, corresponding to identifiers "a" and "b," constitute the original message. It is contemplated that in many embodiments, the exact transformative function, associated interpolation scheme and/or data sharding will necessarily be considerably more complex, for example requiring complex polynomials.

As will be appreciated, the greater the number of additional values generated, the greater the durability of the data, i.e., the less likely a destructive event will prevent the minimum of two messages from being transmitted. The ratio between the number or size (e.g., in bytes) of shards stored and the number or size of the shards necessary to reconstruct the original data is referred to as stretch factor. In many embodiments, the topology and storage strategy of the data storage system have a theoretical minimum stretch factor, below which the encoding provides no real redundancy benefit. In a multi-layer storage system, where several layers (e.g., datacenters, storage servers, storage devices) are nested as described and illustrated in connection with FIG. 2, however, each layer and each component thereof introduces a different set of failure characteristics, including differing modes of failure and failure rates per component. For example, a server or rack of servers may malfunction due to a tripped circuit breaker, but the remainder of the datacenters or the servers within may not be affected. As another example, a device such as a hard disk in a server may develop defective portions of the media therein, but other hard disks, and in some instances, the remaining portions of the affected hard disk's media may remain accessible. As such, in most embodiments, the theoretical minimum stretch factor is approached only with an asymptotically increasing number of shards per input data object. To a certain point, a greater number of shards per input data object may, depending on the system topology and makeup of the data storage system, increase the bandwidth of the system, as the shards will be stored upon and read from a greater number of devices in parallel. However, with a greater number of shards stored, the number of input/output operations per second (IOPS) per byte of object stored increases.

In some embodiments, an optimal redundancy encoding scheme, such as an erasure coding scheme, may be determined from, for example, the object size and the operational characteristics of the device or layer upon which the data object is being stored. A storage system may determine or alter such an optimal redundancy encoding scheme, as well as various implementation details, e.g., the encoding itself, the number of shards into which the encoded object should be broken, and so on, from an analysis of a transaction rate requirement (e.g., bandwidth or throughput requirement) for the data, a durability requirement for the data (e.g., annualized failure rate or other measure of data loss per unit time), and/or various operational characteristics of the storage system and constituent components, such as the bandwidth versus throughput curve of a given storage device. It is contemplated that such an analysis may be performed by the storage system itself, for example upon the data stored thereon. In some embodiments, the transaction rate requirements are provided, via API, by a customer of the storage system. In some embodiments, the data storage system provides the transaction rate requirement, for example, based on analyzing the performance characteristics of the storage system and on the object size(s) of the data stored, and optionally, the associated customer's access patterns to the data. As will be appreciated, the granularity of a redundancy encoding scheme that is predicated on, for example, the sizes of varying objects, customer uses and the like, is scalable. For example, a different scheme may apply to each object, group of objects, customer or the like. Alternatively, the scheme may be based on local or global averages of various data and performance characteristics. In some embodiments, a combination of the two approaches may be used.

In some embodiments, the redundancy encoding scheme may have a scheduling component. As stored data ages, the throughput requirement may change at a known or modelable rate. In many embodiments where frequency of access to the stored data decreases as the data's age increases, the throughput requirement for stored data may decrease as well, as the speed of retrieval becomes less of a factor. In embodiments where such a change may be known ahead of time, determinable from a system analysis of a customer's profile or prior data usage for similar data, provided by the customer itself, or otherwise statistically modelable and/or predictable by the system based on prior knowledge of data access patterns to data previously stored across the system, a schedule wherein the redundancy encoding scheme applied to the data is updated and reapplied to the data may be implemented to allow the encoding to match the change at specified intervals. For example, data may be re-encoded to alter the stretch factor, the number of shards per object or the minimum number of shards required to reconstruct the data, in some instances by altering the applied erasure code(s).

In some embodiments, cost savings generated by, e.g., decreasing the stretch factor in response to a slackening IOPS/byte requirement or durability requirement, may be passed to the customer. In some embodiments where the future throughput requirement is not known in advance or otherwise predictable, a coding update schedule may likewise be incorporated in a garbage collection-like process. For example, some or all data objects stored on the data storage system that are of a specified age or greater may be recoded as part of the scheduled redundancy encoding scheme to decrease the stretch factor of the data objects. In some embodiments, the creation of the scheduled redundancy encoding scheme may be initiated, e.g., via API, by a customer associated with the stored data. It will be appreciated that one intended effect of the redundancy encoding schemes described herein, including a scheme that is scheduled to adjust encoding to alter access and performance characteristics of data based at least in part on age, is to provide a hierarchical storage management (HSM) system without necessitating multiple tiers of hardware storage devices (e.g., SSDs, hard drives and tape) to achieve such differentiation. However, it is contemplated that the techniques described herein also apply to data storage systems with a hierarchical hardware storage structure to provide such systems with similar benefits.

Figure 4:
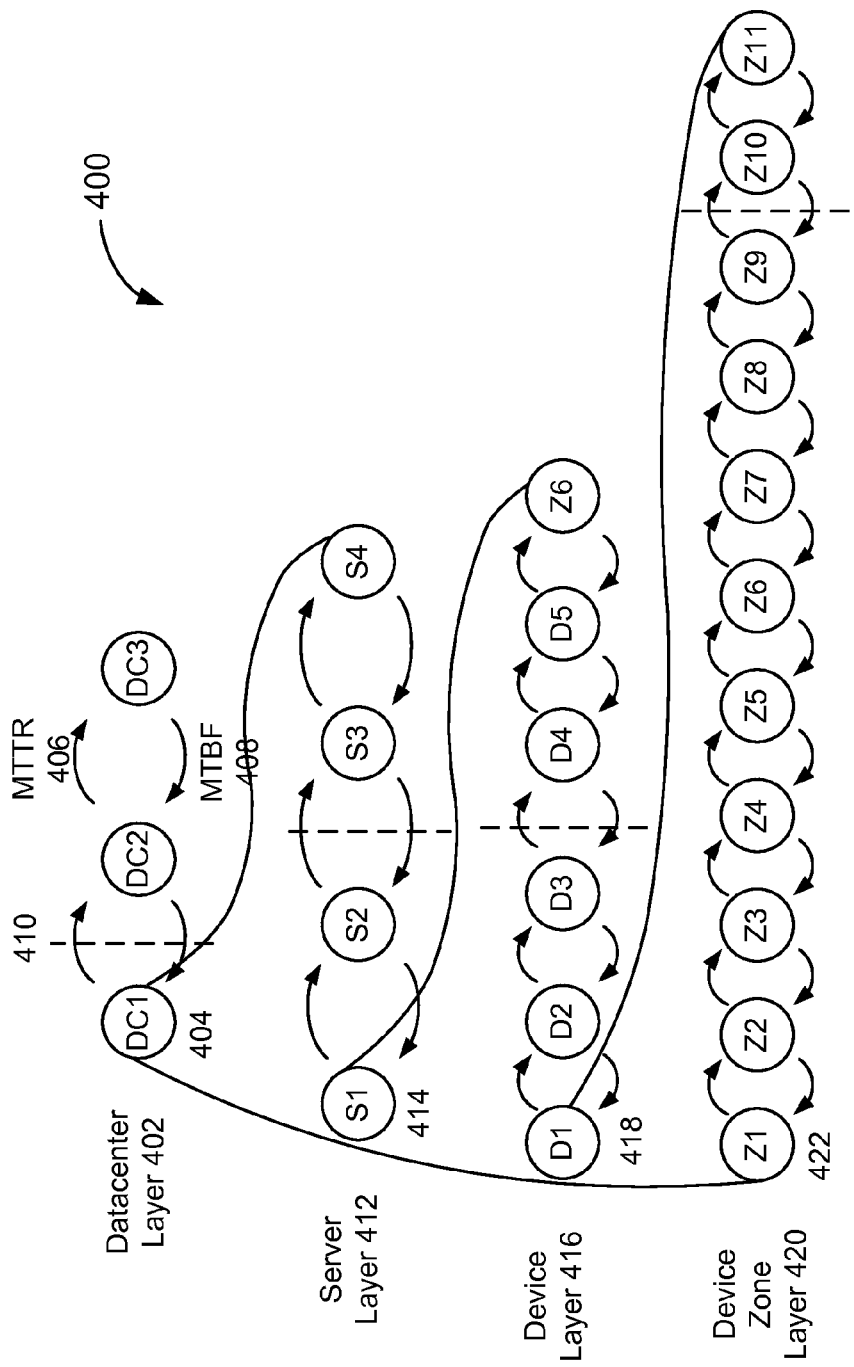
FIG. 4 shows an illustrative example of a Markov chain showing exemplary states and transitions of a redundancy encoding scheme applied to a layered or tiered storage system in accordance with at least one embodiment.

FIG. 4 illustrates a layered storage environment 400 in which various redundancy encoding schemes may be practiced. A datacenter layer 402 includes datacenters 404, which are illustrated as states in a Markov chain, with transition 406 corresponding with a propagation, recovery or reconstitution time or probability, and with transition 408 corresponding to a probability or time to failure, outage or other removal of the datacenter from the system. The dashed line demarcates the limit of the implemented encoding's redundancy 410, the exemplary limit at the datacenter layer corresponding with a 1.5 stretch factor (i.e., data objects stored across all three data centers require two of the datacenters to be functional, and wherein a transition from two functional datacenters to one functional datacenter renders the data objects inaccessible and/or lost). The datacenter layer may, in some embodiments, correspond to the datacenters 204 of data plane 202 as described in connection with FIG. 2. The server layer 412 and servers 414 are similarly illustrated, as are the device layer 416 and devices 418. The servers and devices may, in some embodiments, correspond to the storage servers 206 and storage devices 208 described in connection with at least FIG. 2. As described in connection with FIG. 2, the layers may correspond to any abstraction of hardware, including volumes, instances and the like.

In such a layered environment, a redundancy encoding scheme, in some embodiments including the application of one or more erasure codes, may be implemented such that the transition between redundant/recoverable and unrecoverable is not approached as quickly or as catastrophically, or alternatively, to retain durability while decreasing overall stretch factor. Such a redundancy encoding scheme may, in some embodiments, allocate different encodings to multiple hardware layers for a given data object or set of data objects based on the failure characteristics of the layers, rather than encoding data at only one layer. In such a layered coding scheme, a primary erasure coding is determined based on the global failure characteristics and applied to the data stored upon the system. In the example illustrated, the primary erasure coding scheme may be applied and/or determined globally, and/or based on the characteristics of the datacenter layer.

In some embodiments, the failure characteristics of one or more of the other layers, for example the server and/or device layers, are analyzed for correlation with that of entities with the same layer and/or other layers. In some embodiments, the failure modes of constituent entities of the layer are analyzed.

Based on the analysis, a secondary encoding scheme to either augment or supplant the primary scheme is determined for the data stored to or inherited by the layer(s) for which the analysis was performed. The secondary encoding scheme is then applied to data stored or inherited by the applicable layer. In some embodiments, either or both the primary and secondary encoding schemes may be updated periodically or continuously based on changing failure characteristics of the constituent entities of the applicable hardware layers. As the secondary and primary encoding schemes may, in some embodiments, balance the durability of data with the corresponding stretch factor, in some of such embodiments, a customer may specify, programmatically or otherwise, whether they prefer enhanced durability or decreased cost. Such a customer election may be incorporated into the determination of either or both the primary and/or the secondary encoding schemes.

An example of such a layered redundancy encoding scheme is provided herein. Assuming for the sake of example that the stretch factor associated with the primary encoding at a datacenter layer comprising three datacenters is 2.0 with an average incidence of catastrophic datacenter failure of once per one hundred years, assuming a 5% annual failure rate for devices in the device layer and ignoring the server layer for exemplary ease, the overall durability of the system for the 2.0 primary stretch factor (i.e., four encoded objects or blocks stored, with two required for recover of the original object), the overall durability of the system is approximately one unrecoverable failure per one hundred billion object years. However, upon analyzing the 5% exemplary annual failure rate per device upon which this determined durability is predicated, a system or operator may determine that the entire device only fails 4% of the time, while losing two or fewer data blocks 0.99% of the time and three or more data blocks 0.01% of the time.

Additionally, the system may determine, for sake of example, that the average object size stored to the devices in the device layer is 100 blocks. Thus, a secondary erasure coding to apply to the device layer may have a 1.02 stretch factor, i.e., an object is broken into 102 shards or blocks, of which 100 are required to reconstitute the original data. When applied, the exemplary secondary erasure coding allows the disk to tolerate two or fewer missing blocks per object and still not lose the object, thus decreasing the annual failure rate of the device from 5% to 4.01%, which is significant given that the overall stretch factor associated with the layered redundancy encoding scheme has only increased to 2.0×1.02, or 2.04. Thus, using a layered redundancy encoding scheme, object storage costs may decrease for a given durability or, conversely, durability may increase for a relatively small increase in cost.

The layering of multiple encoding schemes may, in some embodiments, extend to an even more granular level than the device layer. Device zone layer 420 comprising multiple zones 422 of the individual devices in the device layer is illustrated. Such zones may, in some embodiments, be implemented or selected, based on an analysis of the failure modes and characteristics of the parent devices, to minimize certain failure modes or decrease correlation between failures. While such zones may be implemented upon any storage device as may be contemplated by the practitioner, embodiments where the zones are implemented on platter-based devices such as hard disk drives are exemplarily described herein.

Figure 5:
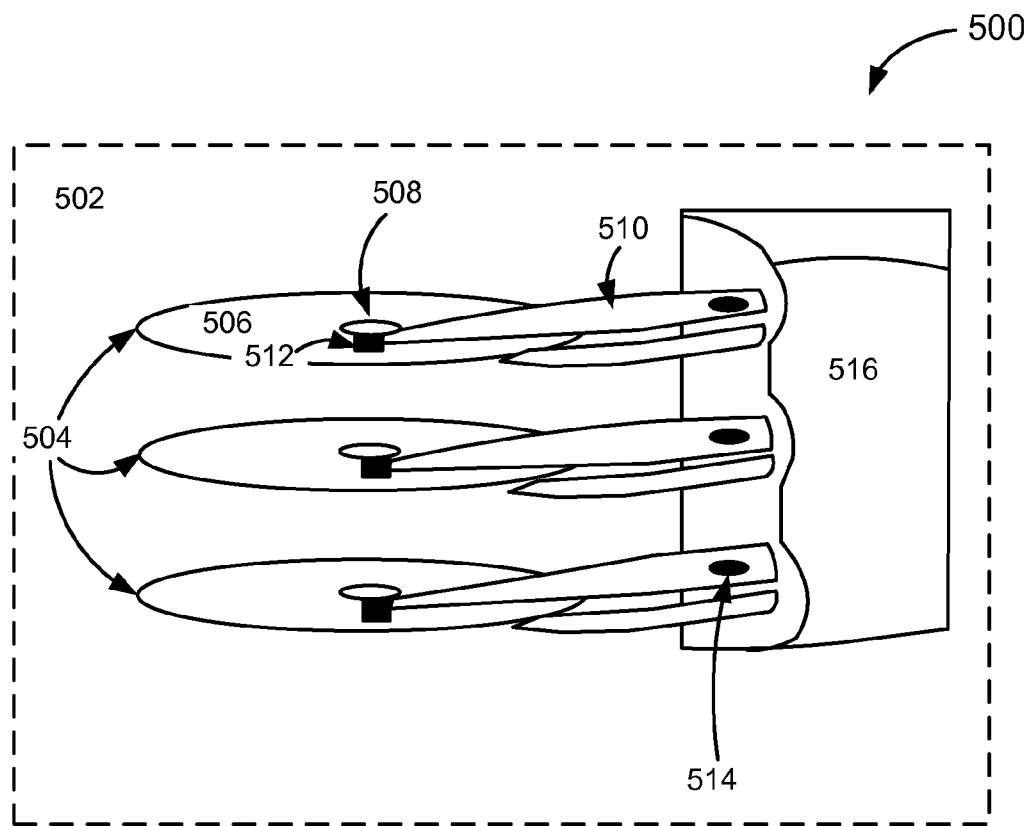
FIG. 5 shows an illustrative example of an electromechanical data storage device on which a reliability modification may be applied in accordance with at least one embodiment.

FIG. 5 is an illustration of an exemplary electromechanical hard disk drive environment 500 upon which correlated failure zoning may be implemented according to some embodiments. In the example given, a hard disk system 502 comprises multiple media platters 504, each having two sides 506 and rotating around a common spindle axis 508. Each platter has two corresponding actuator arms 510 and two heads 512, each platter side corresponding with one of the actuator arms and heads. The actuator arms and heads pivot around an actuator pivot 514, and are driven by an actuator 516. In some examples, normal operation of the hard drive involves the rotation of the platters under the floating heads, which are responsible for both reading and writing data to and from the media resident on the platters. In many of such examples, the hard disk system ordinarily treats all platter sides in the system as a single pool of physical data locations ("sectors"), to which a logical addressing scheme is mapped for external interfacing. As such, data is commonly written without regard to platter borders. A common malfunction in such examples is the degradation or destruction of a limited number of heads and/or associated actuator arms, often one, while the remaining heads and actuators remain functional. However, due to the common "pooling" of sectors and remapping of apparently defective areas of the disk to various other data locations on the hard disk, such malfunctions may result in the entire drive being non-functional, rather than only the affected platter side being taken offline.

In some embodiments, correlated failure zones may be created upon the hard disk, each zone corresponding to a single platter side. Such zones may be created by adapting the hard disk in software, e.g., by using low-level commands accepted by the hard disk (for example, ATA or SCSI commands), in hardware by altering an attached host adapter or the hard disk's controller, or by modifying the firmware of the disk's internal controller. In some embodiments, any remapping requests for apparently defective or inaccessible sectors within a given zone (e.g., by a drive's host system, the drive itself or a user of the drive) are serviced by the adapted or modified drive to only remap to another sector or sectors within the same zone. As, in some embodiments, the zone corresponds to a platter side, the correlation of failures between platter sides and the associated read and write mechanisms is reduced or eliminated.

In some embodiments, an adapted or modified drive may require that any write and/or read requests to the drive include a requested zone or platter identifier so as to further increase the utility of any modified drive malfunctioning in the manner described above. As may be contemplated, such adaptations, modifications and/or implementations may increase the overall reliability of the modified device as well as the durability of the data stored thereon. Additionally, in some embodiments, the zones may collectively or individually addressed as a layer as described in connection with FIG. 4, and thus be subject to an application of an associated secondary redundancy encoding to increase the reliability of stored data for minimal cost, or to decrease storage cost for a given durability level, also as described in connection with at least FIG. 4.

Figure 6:
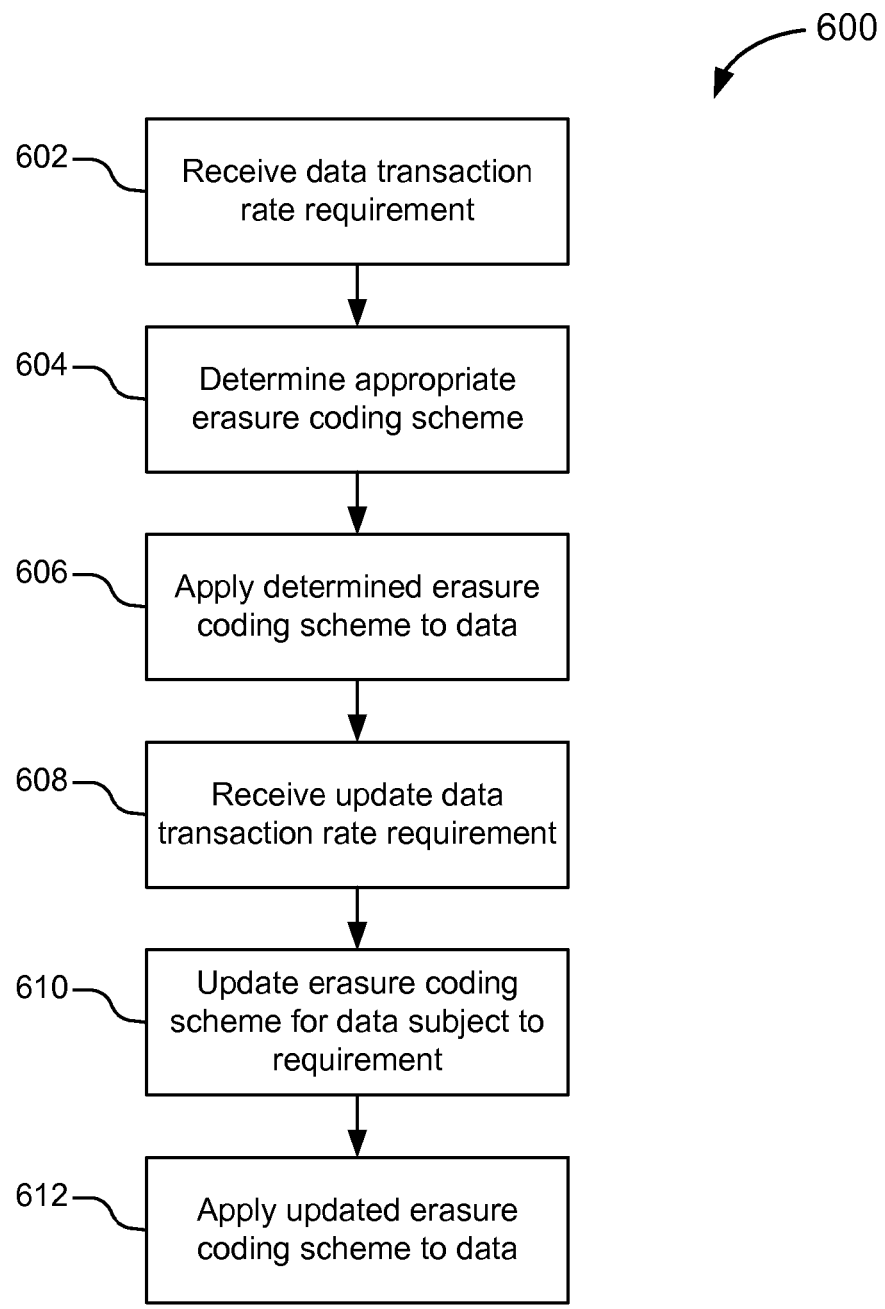
FIG. 6 shows an illustrative example of a process for encoding data with a redundancy encoding scheme based on transaction rate requirements according to at least one embodiment.

FIG. 6 illustrates an example process 600 for encoding data according to a redundancy encoding scheme sensitive to transaction rate requirements. Some or all of the process 600 (or any other processes described herein, or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

A data transaction rate requirement is received 602, from which one or more appropriate redundancy encoding schemes, such as erasure coding schemes as described in connection with at least FIG. 3, are determined 604. As described in connection with at least FIG. 3, the transaction rate requirement may be a bandwidth requirement, a throughput requirement, or some balance or combination of the two, and be either (or both) derived by an implementing system based on object sizes of the stored data or provided manually by some entity, including the owner of the data. As previously described, such requirements may be manually provided by programmatic means (e.g., through an API) or through a user interface. In some embodiments, the erasure coding schemes are determined based on an analysis of the transaction rate requirement, the operational characteristics of the storage system or components thereof (such as the performance characteristics of a given storage device as throughput and/or bandwidth requirements for data stored thereon are increased or decreased) and/or durability requirements. The durability requirements may be determined or set by any applicable entity, including the implementing system, the entity determining the coding scheme or one or more customers connected to the data. For example, as previously described, durability requirements may be determined by analyzing the data itself to determine an expected usage pattern or use case for the data, as well as by analyzing a failure rate per unit time of the implemented storage system or components therein. Such requirements may also be set by the implementing storage system as a matter of policy, requested or determined by the customer associated with the data or by some other entity with input into the system.

After the erasure coding schemes are determined, one or more of the determined schemes are applied to data stored upon the storage system 606. Such schemes may be applied to data existing on the system, as a system policy for data to be written, or some combination therebetween. Optionally, at some point after the initial set of coding schemes have been applied and upon receiving at least an updated transaction rate requirement for the data 608, one or more of the erasure coding schemes may be updated to address the updated requirement 610, and the updated scheme may be applied to the data 612. The nature, manner of communication, and determination of the updated requirements and updated coding scheme may be similar to that which was previously described in connection with steps 602 and 604. Additionally, the data upon which the updated scheme is applied may, in some embodiments, first be decoded to regenerate the original data prior to the application of the updated scheme. Alternatively, the updated scheme may overlay and/or augment the originally applied scheme.

Figure 7:
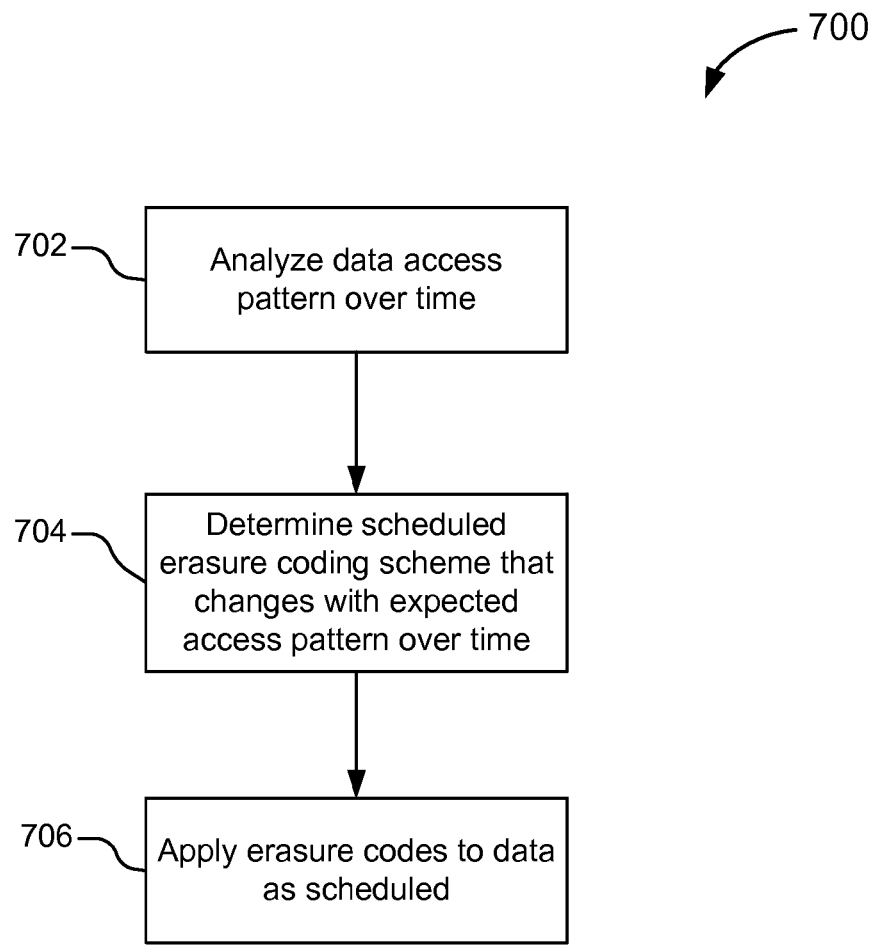
FIG. 7 shows an illustrative example of a process for encoding data with a redundancy encoding scheme that accounts for changes in data characteristics over time according to at least one embodiment.

FIG. 7 illustrates an example process 700 for encoding data according to a scheduled redundancy encoding scheme. In some embodiments, access patterns over time to data stored on a storage system are analyzed 702. As previously described in connection with at least FIG. 3, such an analysis may be conducted by a system to model a predicted access pattern to the data over time, or, in some embodiments, the analysis may be provided by a customer that has an intended use or pattern of use for the data for a period of time after the data is initially stored. In some embodiments, a redundancy encoding scheme, such as the erasure coding scheme described in connection with at least FIG. 3, may thereupon incorporate a scheduling component if such a schedule is requested or deemed necessary based on the analysis. The particular coding schemes (or components of such schemes) at each interval of the determined schedule are determined with respect to the expected access patterns over time, for example, during the period between a present checkpoint in the determined schedule and the next scheduled checkpoint.

The determined encodings may then be applied to the data according to the schedule 706. In some embodiments, the schedule is intended to decrease the stretch factor over time of data subject to the scheme in order to match a decaying durability or throughput requirement. As previously discussed, such decreases may inure to the benefit of either or both the customer associated with the data and the storage system itself, and the balance between cost savings, durability increases and system utilization efficiency may be defined by the customer, the system or both (e.g., through API requests). It is contemplated that such scheduled schemes may be implemented as, or wholly constitute, generational garbage collection-like routines that optimize various storage characteristics of the data at specified intervals, and based at least in part on system conditions and characteristics, such as system utilization, measured reliability and the like.

Figure 8:
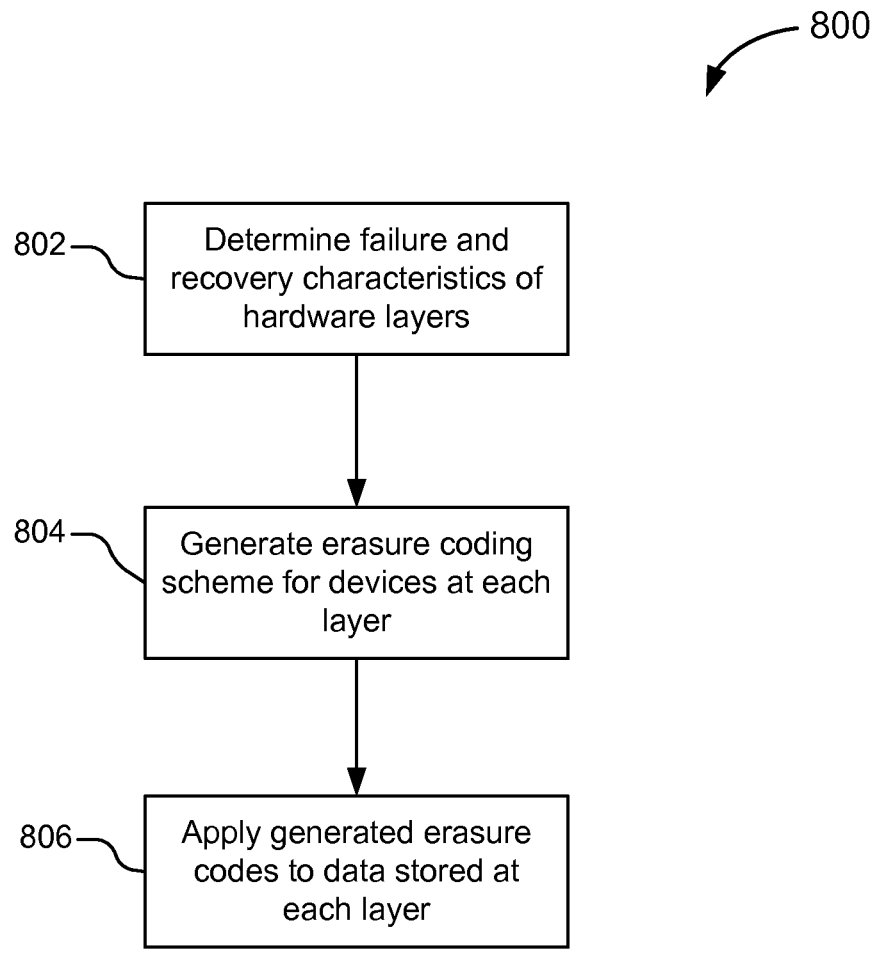
FIG. 8 shows an illustrative example of a process for encoding data at multiple layers of a data storage system with a redundancy encoding scheme according to at least one embodiment.

FIG. 8 illustrates an example process 800 for encoding data according to a layered redundancy encoding scheme. Failure and recovery characteristics of the layers of a storage system are determined and analyzed 802. As previously discussed in connection with FIG. 4, the layers may correspond to logical or physical groupings of devices that share common failure and/or recovery characteristics, such as failure modes, susceptibility and the like. For example, one layer may contain datacenters, another may contain the data storage servers of one or more of the datacenters and another layer may be comprised of the data storage devices (e.g., hard drives) of one or more of the data storage servers. Also as discussed in connection with FIG. 4, the failure and/or recovery characteristics of the layers, or components thereof, are analyzed with respect to correlation of the potential failures thereof, the types of failures and the probabilities of each failure happening and the like. Such analysis may, for example, provide failure profiles for the analyzed layers and components, from which one more redundancy encodings may be generated.

As noted, analysis may dictate or influence the generation of a one or more redundancy encodings, such as one or more erasure codings, for one or more of the layers for which the analysis was performed. For example, a primary erasure coding may be determined for the datacenter layer 402 of FIG. 2, while secondary erasure codings may be performed to minimize one or more analyzed failure modes of, e.g., the device layer 416. Such erasure codings, both primary and secondary, may be generated to either increase durability for a small increase in stretch factor, or to hold durability at a prescribed level and further decrease stretch factor, and in some embodiments, cost and/or storage efficiency. After such erasure codings are generated, they are applied to the applicable layers 806, either to supplant an existing erasure coding (e.g., an after-determined secondary erasure coding replacing a general primary erasure coding for a subset of data) or to augment it, e.g., as provided in the example provided in connection with FIG. 4.

Figure 9:
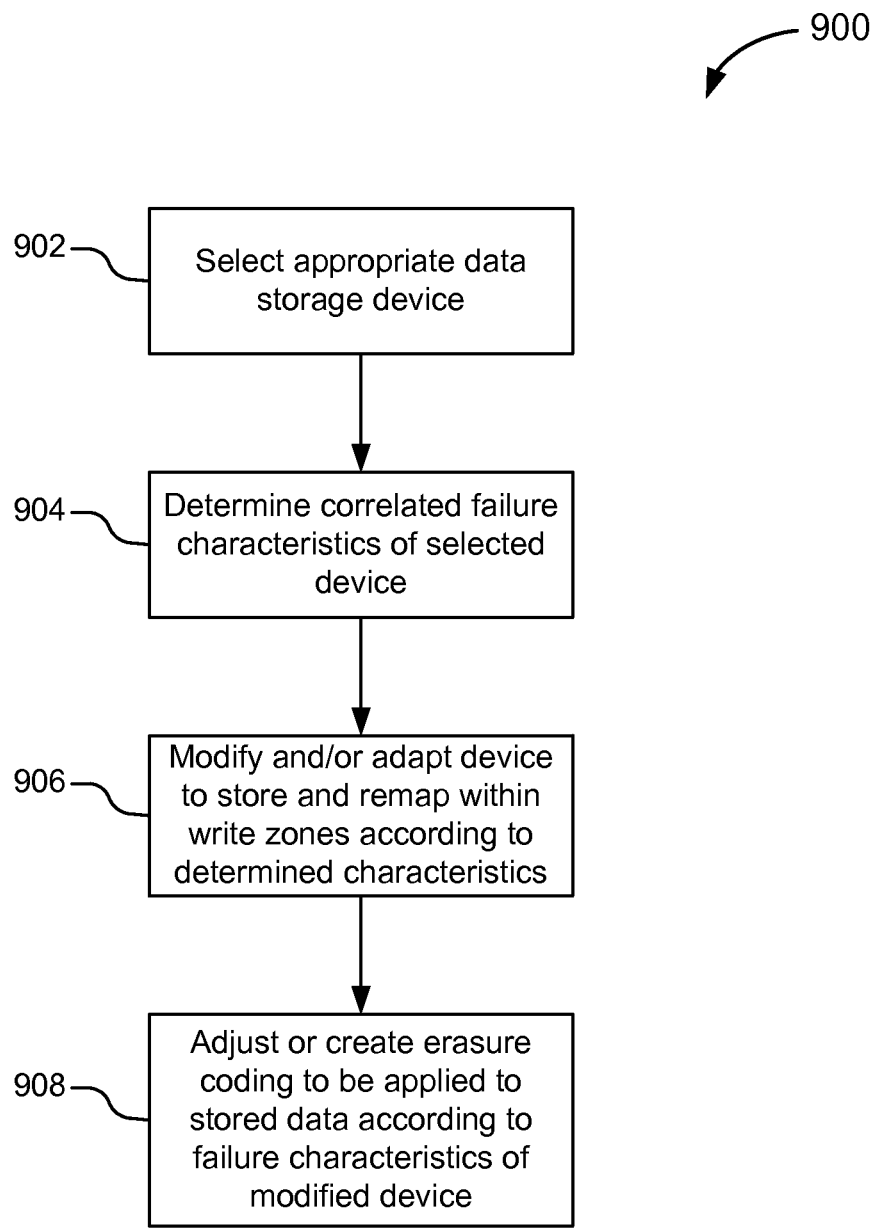
FIG. 9 shows an illustrative example of a process for improving the data storage reliability of a hardware storage device according to at least one embodiment.

FIG. 9 illustrates an example process 900 for decreasing failure correlation on a data storage device, such as an electromechanical hard disk drive. In some embodiments, an appropriate data storage device is selected for modification and/or adaptation 902. Such devices may be selected for modification and/or adaptation based on, for example, the addressability of various failure modes and probabilities inherent to the device. For example, the selected data storage device may be an electromechanical hard disk drive as illustrated and described in connection with FIG. 5, as such a drive, as described, due to the manner in which the drive physically stores data upon its various platter surfaces. However, any device that stores data and for which various failure modes may be correlated and/or grouped may be selected. The correlated failure characteristics of the selected device are determined and analyzed 904 in order to group, e.g., data storage locations subject to correlated failures into zones.

The device is thereafter modified and/or adapted to create the zones, as well as to respond to write and remap requests by isolating writes and remaps to a given zone 906. As described in connection with FIG. 5, the device may be adapted or modified by a number of methods, including modification of controllers, firmware updates, software implementations and the like. For example, as exemplarily described in connection with at least FIG. 5, an electromechanical hard disk drive may be rezoned such that each zone correlates with a given platter side, such that the disablement or malfunction of the read/write apparatus for that platter side does not prevent other platter sides from being accessed. Optionally, one or more of the resultant zones may be grouped into a zone layer as part of a layered data storage system, such as the layered system described in connection with FIG. 4, and a redundancy encoding, for example the erasure coding also described in connection with FIG. 4, may be updated to take the failure characteristics of the zone layer or the adapted device into account.

Figure 10:
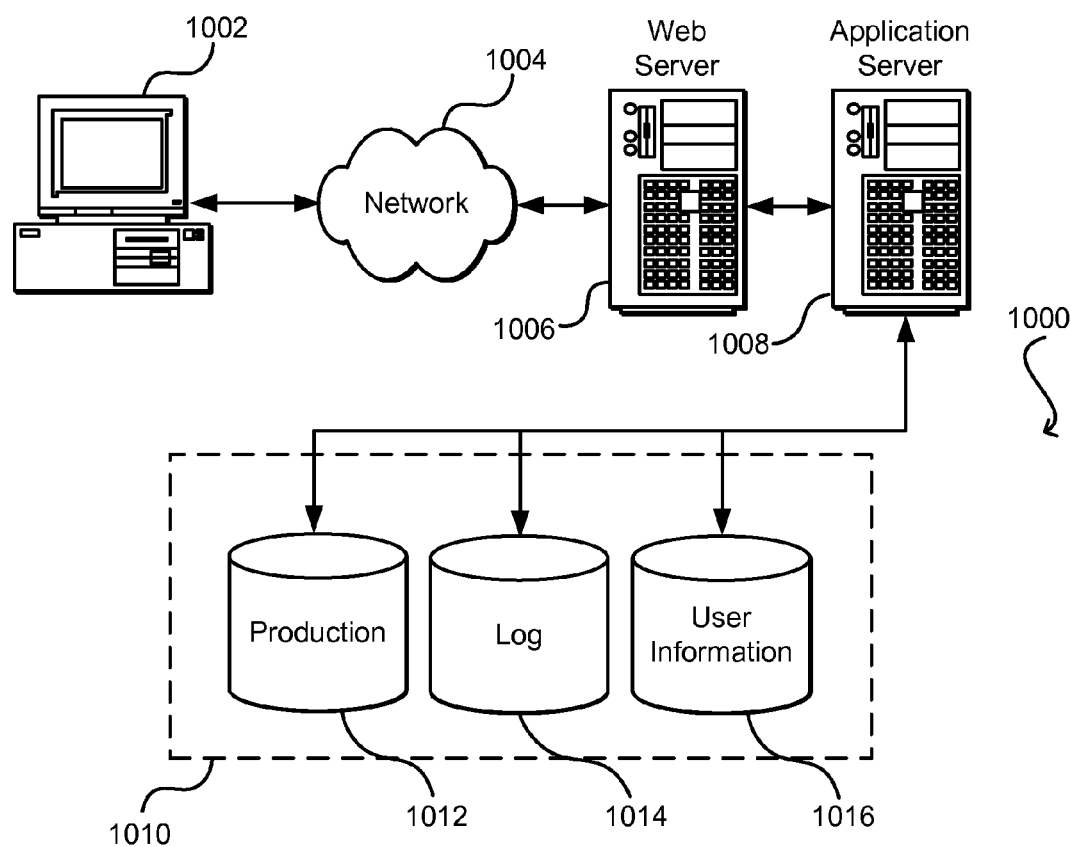
FIG. 10 illustrates an environment in which various embodiments can be implemented.

FIG. 10 illustrates aspects of an example environment 1000 for implementing aspects in accordance with various embodiments. As will be appreciated, although a Web-based environment is used for purposes of explanation, different environments may be used, as appropriate, to implement various embodiments. The environment includes an electronic client device 1002, which can include any appropriate device operable to send and receive requests, messages or information over an appropriate network 1004 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections, and combinations thereof. In this example, the network includes the Internet, as the environment includes a Web server 1006 for receiving requests and serving content in response thereto, although for other networks an alternative device serving a similar purpose could be used as would be apparent to one of ordinary skill in the art.

The illustrative environment includes at least one application server 1008 and a data store 1010. It should be understood that there can be several application servers, layers or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices, and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store, and is able to generate content such as text, graphics, audio and/or video to be transferred to the user, which may be served to the user by the Web server in the form of HTML, XML or another appropriate structured language in this example. The handling of all requests and responses, as well as the delivery of content between the client device 1002 and the application server 1008, can be handled by the Web server. It should be understood that the Web and application servers are not required and are merely example components, as structured code discussed herein can be executed on any appropriate device or host machine as discussed elsewhere herein.

The data store 1010 can include several separate data tables, databases or other data storage mechanisms and media for storing data relating to a particular aspect. For example, the data store illustrated includes mechanisms for storing production data 1012 and user information 1016, which can be used to serve content for the production side. The data store also is shown to include a mechanism for storing log data 1014, which can be used for reporting, analysis or other such purposes. It should be understood that there can be many other aspects that may need to be stored in the data store, such as for page image information and to access right information, which can be stored in any of the above listed mechanisms as appropriate or in additional mechanisms in the data store 1010. The data store 1010 is operable, through logic associated therewith, to receive instructions from the application server 1008 and obtain, update or otherwise process data in response thereto. In one example, a user might submit a search request for a certain type of item. In this case, the data store might access the user information to verify the identity of the user, and can access the catalog detail information to obtain information about items of that type. The information then can be returned to the user, such as in a results listing on a Web page that the user is able to view via a browser on the user device 1002. Information for a particular item of interest can be viewed in a dedicated page or window of the browser.

Each server typically will include an operating system that provides executable program instructions for the general administration and operation of that server, and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 10. Thus, the depiction of the system 1000 in FIG. 10 should be taken as being illustrative in nature, and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A computer-implemented method for optimizing data storage comprising:
    applying, by one or more computer systems, a primary erasure coding scheme to original data stored on a storage system comprising a plurality of hardware tiers, at least one of which is a physical storage tier that comprises a plurality of hardware storage devices upon which at least a subset of the original data is stored, thereby generating primary encoded data, the primary redundancy encoding including one or more erasure codes;
    analyzing one or more modes of operation of at least the physical storage tier, the one or more modes corresponding to one or more types of partial failure of one or more hardware storage devices of the plurality of hardware storage devices in the physical storage tier;
    determining, based at least in part on the analyzing of the one or more modes, a secondary erasure coding scheme for the physical storage tier; and
    applying the secondary erasure coding scheme to the subset of the original data stored upon the one or more hardware storage devices of the physical storage tier, wherein the secondary redundancy encoding includes one or more erasure codes that alter a ratio between a size of the original data stored and the size of the primary encoded data needed to restore the original data.

2. The computer-implemented method of claim 1, wherein individual tiers of the remaining hardware tiers of the plurality of hardware tiers comprise a plurality of devices of one type, the one type selected from the group consisting of datacenters, storage servers, hardware storage devices, and storage device zones.

3. The computer-implemented method of claim 2, wherein the plurality of hardware storage devices include hard disk drives that have been configured to internally reduce correlation of hardware failure types, the correlation of hardware failure types internally reduced at least in part by limiting remapping of data written to a zone of writable media of the hard disk drive to a same zone.

4. The computer-implemented method of claim 1, wherein the plurality of hardware tiers are arranged in a hierarchy that corresponds with a device hierarchy of the storage system.

5. The computer-implemented method of claim 1, wherein the secondary erasure coding scheme is continuously updated as the modes of the physical storage tier change over time.

6. A computer-implemented method for optimizing data storage comprising:
applying, by one or more computer systems, a primary redundancy encoding scheme to data stored across a plurality of system tiers of a storage system, thereby generating primary encoded data, the primary redundancy encoding including one or more erasure codes;
determining, based at least in part on analyzing one or more storage characteristics of at least a subset of the system tiers, at least one secondary redundancy encoding scheme; and
applying the secondary redundancy encoding scheme to data stored on the subset of system tiers for which the storage characteristics are analyzed, wherein the secondary redundancy encoding scheme includes one or more erasure codes that alter a ratio between a size of the data stored and a size of the primary encoded data.

7. The computer-implemented method of claim 6, wherein the primary redundancy coding scheme contains one or more primary erasure codes that are applied to an entirety of the data stored across the storage system.

8. The computer-implemented method of claim 7, wherein the secondary redundancy encoding scheme contains one or more secondary erasure codes that are applied to the data stored upon the subset of system tiers in addition to the one or more primary erasure codes.

9. The computer-implemented method of claim 6, further comprising at a time after determining the secondary redundancy encoding scheme, applying the secondary error correction coding scheme to the stored data to replace the application of the redundancy encoding scheme.

10. The computer-implemented method of claim 6, wherein the one or more storage characteristics include at least a rate of failures per unit of time of the subset of system tiers.

11. A data storage system, comprising:
a plurality of storage tiers;
one or more processors; and
memory, including instructions executable by the one or more processors to cause the computer system to at least:
apply a primary redundancy encoding to original data stored across at least a subset of the plurality of storage tiers, thereby generating primary encoded data, the primary redundancy encoding including one or more erasure codes;
determine a secondary redundancy encoding from an analysis of reliability information for at least the subset of storage tiers upon which the primary encoded data is stored; and
apply the secondary redundancy encoding to the primary encoded data, wherein the secondary redundancy encoding includes one or more erasure codes that, when applied to the stored data, alter a ratio between a size of the original data and a size of the primary encoded data.

12. The data storage system of claim 11, wherein the secondary redundancy encoding, when applied, improves at least one of the ratio between the size of the original data and the size of the primary encoded data, a durability level of the primary encoded data, or a recovery time for regenerating the primary encoded data.

13. The data storage system of claim 11, wherein the subset of storage tiers comprises a data volume that is accessible to a user of the data storage system.

14. The data storage system of claim 11, wherein the reliability information is provided by a user of the data storage system.

15. One or more non-transitory computer-readable storage media having collectively stored thereon executable instructions that, when executed by one or more processors of a computing resource provider's computer system, cause the computer system to at least:
cause a primary encoding, using a primary error correction coding scheme, of data stored upon a storage subsystem of the computer system, the storage subsystem including a plurality of storage tiers, thereby generating primary encoded data, the primary redundancy encoding including one or more erasure codes;
analyze one or more failure modes of at least a subset of the plurality of storage tiers;
determine, based at least in part on the analysis of the one or more failure modes, at least one secondary error correction coding scheme to be applied to at least a subset of the plurality of storage tiers; and
cause the determined secondary error correction coding scheme to be applied to the associated subset of storage tiers, wherein the secondary error correction coding scheme includes one or more erasure codes that alter a ratio between a size of the data and a size of the primary encoded data.

16. The non-transitory computer-readable storage media of claim 15, wherein the instructions cause the computer system to further provide a programmatic interface that enables customers of the computing resource provider to at least request storage and retrieval of the data upon the storage subsystem.

17. The non-transitory computer-readable storage media of claim 15, wherein the subset of the plurality of storage tiers includes hardware data storage devices.

18. The non-transitory computer-readable storage media of claim 15, wherein the secondary error correction coding scheme contains a coding hierarchy of erasure codes that each correspond to a storage tier of the plurality of storage tiers, the plurality of storage tiers being arranged into a tier hierarchy that corresponds with the coding hierarchy.

19. The non-transitory computer-readable storage media of claim 15, wherein the storage subsystem comprises a plurality of data centers that further comprise a plurality of hardware data storage devices.

20. The non-transitory computer-readable storage media of claim 19, wherein the plurality of data centers comprise a first storage tier among the plurality of storage tiers, and the plurality of hardware data storage devices comprise a second storage tier among the plurality of storage tiers.

* * * * *